United States Patent
Touzelbaev et al.

(10) Patent No.: US 7,833,839 B1
(45) Date of Patent: Nov. 16, 2010

(54) METHOD FOR DECREASING SURFACE DELAMINATION OF GEL-TYPE THERMAL INTERFACE MATERIAL BY MANAGEMENT OF THE MATERIAL CURE TEMPERATURE

(75) Inventors: Maxat Touzelbaev, San Jose, CA (US); Raj Master, San Jose, CA (US); Frank Kuechenmeister, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 340 days.

(21) Appl. No.: 11/856,033

(22) Filed: Sep. 15, 2007

(51) Int. Cl.
*H01L 21/00* (2006.01)
(52) U.S. Cl. .................. 438/122; 438/121; 438/118; 257/706; 257/720; 257/E23.104; 257/E23.106
(58) Field of Classification Search ............... 438/118, 438/119, 122, 106, 121, 125; 257/706, 704, 257/712, 720, E23.101, E23.107, E23.106, 257/E23.104
See application file for complete search history.

(56) References Cited

U.S. PATENT DOCUMENTS

| | | | |
|---|---|---|---|
| 4,564,562 A | | 1/1986 | Wong |
| 5,672,548 A | * | 9/1997 | Culnane et al. ............ 438/118 |
| 6,617,683 B2 | | 9/2003 | Lebonheaur et al. |
| 6,650,019 B2 | * | 11/2003 | Glenn et al. ................ 257/777 |
| 6,706,562 B2 | | 3/2004 | Mahajan et al. |
| 7,013,965 B2 | | 3/2006 | Zhong et al. |
| 7,362,580 B2 | * | 4/2008 | Hua et al. ................... 361/709 |
| 7,405,247 B2 | * | 7/2008 | Sachdev et al. ............ 523/457 |
| 7,489,033 B2 | | 2/2009 | Hua et al. |
| 2007/0151416 A1 | * | 7/2007 | Cheng et al. ................. 75/252 |

OTHER PUBLICATIONS

USPTO Office Action mailed May 18, 2009; U.S. Appl. No. 11/846,618.

* cited by examiner

*Primary Examiner*—Julio J Maldonado
(74) *Attorney, Agent, or Firm*—Ditthavong, Mori & Steiner, P.C.

(57) ABSTRACT

Various methods and apparatus for establishing a thermal pathway for a semiconductor device are disclosed. In one aspect, a method of manufacturing is provided that includes placing a gel-type thermal interface material in a preselected pattern on a semiconductor chip that is coupled to a substrate. The preselected pattern of gel-type thermal interface material is allowed to partially set up. Additional thermal interface material is placed on the semiconductor chip and cured.

21 Claims, 5 Drawing Sheets

METHOD FOR DECREASING SURFACE DELAMINATION OF GEL-TYPE THERMAL INTERFACE MATERIAL BY MANAGEMENT OF THE MATERIAL CURE TEMPERATURE

BACKGROUND OF THE INVENTION

1. Field of the Invention

This invention relates generally to semiconductor processing, and more particularly to apparatus and methods for packaging a semiconductor chip with a thermal interface material.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to indium as a thermal interface material, particularly for high power-high temperature chips.

A metal thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing.

Not all dice on a given wafer clock natively at the same speed. Those chips that natively clock higher may be selected for high performance applications and markets. Those chips that natively clock out at slower speeds may still be quite useful in less intensive computing environments where the thermal environment is correspondingly less hostile. For the slower chips, a metal thermal interface material may not be necessary to carry the thermal load and may even be carry an economic penalty. In such circumstances, it may be desirable to use a gel-type thermal interface material.

Unfortunately, gel-type thermal interface materials do not adhere well with at least one conventional design for a backside metallization stack that uses a gold film as the top-most layer. Inevitable flexure of the die and package substrate can stretch the thermal interface material and cause delamination where there is poor adhesion with the gold film. Delamination causes the thermal resistance of the pathway from the chip to the lid to climb, perhaps to the point of thermal shutdown. The flexing behavior of a substrate mounted die is a rather complex interplay of various factors. In a typical system, the die, the substrate and an underfill material between the two each exhibit a different coefficient of thermal expansion (CTE). The differences are sometimes a factor of ten or more. Not surprisingly then, the die and the substrate flex at different rates as a function of temperature. As a result, the substrate and die usually exhibit some amount of warpage that is dependent on temperature. The amount of warpage is frequently greatest at near room temperatures and decreases with increasing temperature. At high temperatures associated with device operation and the thermal cures used to cure conventional thermal interface materials and lid adhesives, the substrate and die tend to flatten. As the die and substrate flatten, the conventional thermal interface material layer is subjected to tensile forces that can cause voids and delamination.

A conventional gel-type thermal interface material contains a small initial concentration of platinum that is designed to acts as a catalyst to improve bonding between a conventional gold film and the thermal interface material. The platinum particles are mixed into the gel prior to application to the gold film. Through mechanisms that are not well understood, the catalytic properties become poisoned by the gold film. Less than optimal bonding may occur and the risk of delamination remains.

The present invention is directed to overcoming or reducing the effects of one or more of the foregoing disadvantages.

SUMMARY OF THE INVENTION

In accordance with one aspect of the present invention, a method of manufacturing is provided that includes placing a gel-type thermal interface material in a preselected pattern on a semiconductor chip that is coupled to a substrate. The preselected pattern of gel-type thermal interface material is allowed to partially set up. Additional thermal interface material is placed on the semiconductor chip and cured.

In accordance with another aspect of the present invention, a method of manufacturing is provided that includes placing a gel-type thermal interface material on a semiconductor chip coupled to a substrate. The gel-type thermal interface material is cured at about 22 to 125° C.

In accordance with another aspect of the present invention, a method of manufacturing is provided that includes forming a metal layer on a semiconductor chip, coupling the semiconductor chip to a substrate and providing a catalyst on the metal layer. A gel-type thermal interface material is placed on the metal layer and cured at about 22 to 125° C.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
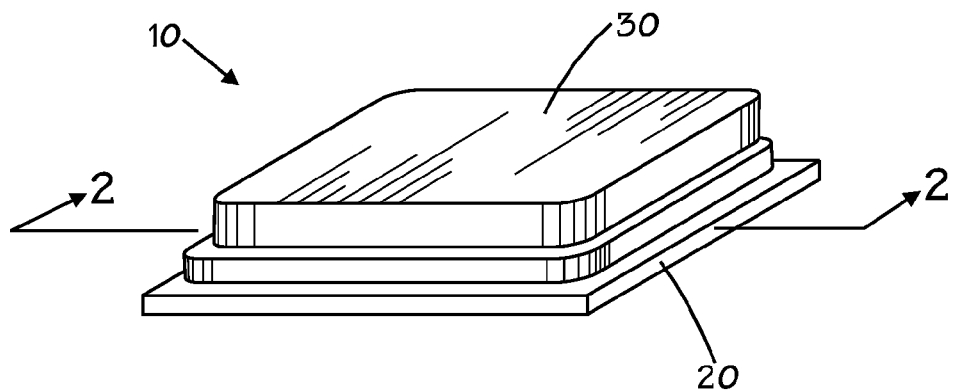
FIG. 1 is a pictorial view of an exemplary embodiment of a semiconductor device package.

In the drawings described below, reference numerals are generally repeated where identical elements appear in more than one figure. Turning now to the drawings, and in particular to FIG. 1, therein is shown a pictorial view of an exemplary embodiment of a semiconductor device package 10 that includes a base substrate 20 and a lid 30 positioned thereon. Together, the substrate 10 and the lid 30 enclose an integrated circuit that is not visible in FIG. 1 but is shown in subsequent figures. The lid 30 is depicted as a top hat design, although virtually any type of lid may be suitably used with the package 10.

Figure 2:
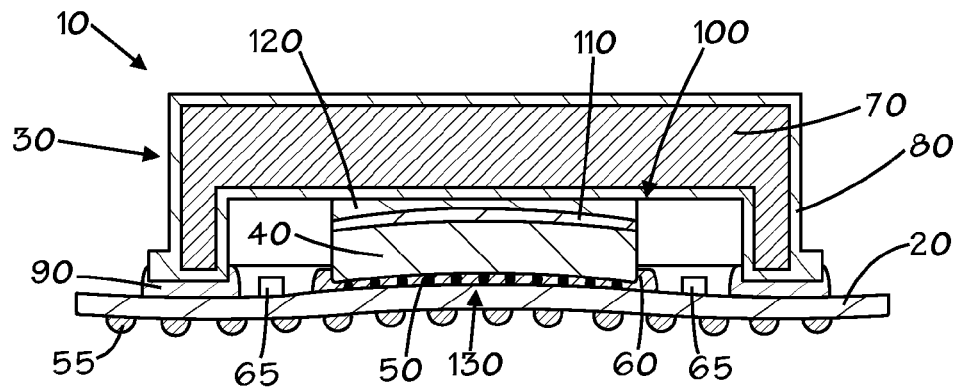
FIG. 2 is a sectional view of FIG. 1 taken at section 2-2.

Additional detail of the package 10 may be understood by referring now also to FIG. 2, which is a sectional view of FIG. 1 taken at section 2-2. An integrated circuit 40, which may be a semiconductor device, chip or other type of device as desired is mounted on the base substrate 20. The integrated circuit 40 may be any of a myriad of different types of circuit devices used in electronics, such as, for example, microprocessors, graphics processors, application specific integrated circuits, memory devices or the like, and may be single or multi-core. The semiconductor device 405 may be composed of silicon, germanium or the like and may be bulk semiconductor or semiconductor-on-insulator. The semiconductor device 40 is shown flip-chip mounted to the substrate 20 and electrically interconnected therewith by way of a plurality of conductor structures 50 which are depicted as small white black ovals. The conductor structures 50 may be solder bumps or balls, conductive pillars of copper or other conductive materials used with or without solder or the like.

The substrate 20 may interconnect electrically with external devices, such as another circuit board, in a variety of ways. In the exemplary embodiment, a ball grid array consisting of a plurality of conductor balls 55 projects from the substrate 20. The substrate 20 includes electrical interconnects that are not visible but are present to establish electrical connectivity between the array of balls 55 and the conductor structures 50. Optionally, a pin grid array, a land grid array or some other type of interconnect configuration may be used. The substrate 20 may be formed from polymeric materials, ceramic materials or the like. The substrate 20 may actually consist of multiple layers of metallization and dielectric materials that electrically interconnect the conductor balls 55 to various portions of the integrated circuit 40 by way of the conductors 50. The number of individual layers is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill.

An underfill material 60 is positioned between the semiconductor device 40 and the substrate to cushion and address issues of differing CTE's for the substrate 20 and the semiconductor device 40. The underfill material 60 may be composed of well-known epoxy materials, such as epoxy resin with or without silica fillers and phenol resins or the like.

The substrate 20 may be provided with plural passive devices 65, such as capacitors, inductors and resistors, to facilitate the operation of the semiconductor device 40. The passive devices 65 may be on, in or below the substrate 20 or some combination of those positions.

The lid 30 may be composed of well-known plastics, ceramics or metallic materials as desired. Some exemplary materials include nickel plated copper, anodized aluminum, aluminum-silicon-carbon, aluminum nitride, boron nitride or the like. In an exemplary embodiment, the lid 30 may consist of a copper core 70 surrounded by a nickel jacket 80. Optionally, the lid 30 may be other than a bathtub configuration. Indeed, a heat spreader other than a lid may be used. For example the substrate 20 may be a circuit board or card and the semiconductor device 40 may be mounted thereon without a lid but with a heat sink.

An adhesive bead 90 is positioned on the base substrate 20 in order to secure the lid 30. The adhesive 90 has a general outline that tracks the shape of the perimeter of the overlying lid 30. The adhesive 90 may be a continuous bead or a series of segments as desired. The adhesive 90 may be composed of well-known epoxies or other types of adhesives.

One of the principal purposes of the lid 30 is to transfer heat away from the semiconductor device 40. Thus, it is desirable to provide a low thermal resistance pathway between a lower surface 100 of the lid 30 and the semiconductor device 40. The pathway may consist of a backside metallization layer 110 formed on the semiconductor device 40 and a thermal interface material layer 120 sandwiched between the backside metallization layer 110 and the underside 100 of the lid 30. The backside metallization layer 110 may consist of a stack of materials that facilitate bonding between the lid 30 and the thermal interface material 120. The materials suitable for the stack 110 will generally depend on the type of thermal interface material 120 and the composition of the semiconductor device 40. Metallic thermal interface materials, such as indium or gallium, have good thermal properties that make them desirable for high temperature-high power circuits. However, such metals require a contact surface of gold, gallium or the like to readily wet during reflow. Accordingly, the top layer of the stack 110 may be gold, palladium or the like. Aluminum adheres well to silicon and thus is often selected as the first layer of the stack 110 formed on the semiconductor device 40. To prevent diffusion of metal into the semiconductor device 40, a barrier layer of, for example, titanium is formed on the aluminum layer. Finally, to facilitate adhesion with the gold top layer, a layer of material that adheres to both titanium and gold is used. An example is a mixture of vanadium and nickel.

The thermal interface material 120 is advantageously composed of metallic materials, such as indium, gallium or the like, or polymeric materials such as, for example, silicone rubber mixed with aluminum particles and zinc oxide. Optionally, compliant base materials other than silicone rubber and thermally conductive particles other than aluminum may be used. Such polymeric materials may be termed "gel-type" materials. As noted in the Background section hereof, it may be desirable to use a "gel-type" in conjunction with a semiconductor device 40 fitted with a backside metallization stack. Where gold or the like is used as the top layer of the stack, delamination of the gel-type thermal interface material can occur due to thermal stresses and poor adhesion to the gold film.

The substrate 20 has a certain degree of ductility. As a consequence, the substrate 20 has a tendency to warp. The amount and location of the warpage is dependent upon a variety of factors, such as the mechanical stiffness and CTE of the substrate 20, the type, amount, and curing temperature of the adhesive 120, the type, amount and curing temperature of the underfill 60, the type, thickness and curing temperature of the thermal interface material 120, and the size and CTE of the semiconductor chip 40. The amount of warpage is also highly dependent upon the temperature of the package 10 and in particular the substrate 20 and the semiconductor chip 40. FIG. 2 represents the typical warpage of the substrate 20 in the temperature range of about 25 to 60° C. Note that there is an upwardly projecting warpage at a central region 130 of the substrate 20.

Figure 3:
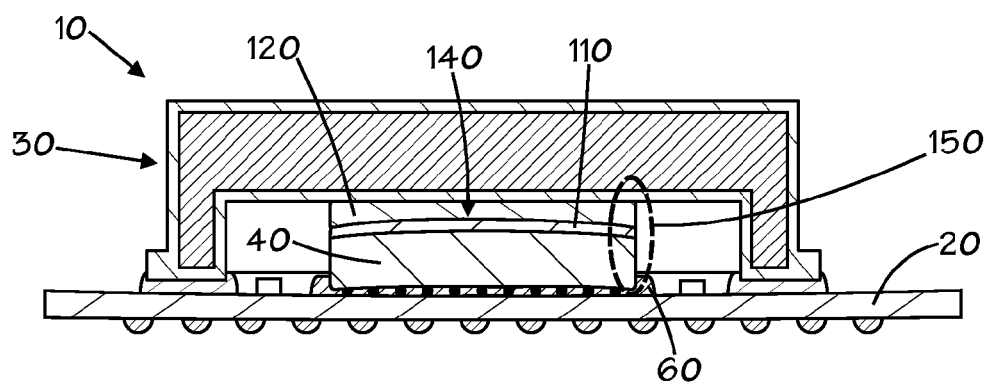
FIG. 3 is another sectional view of FIG. 1 taken at section 2-2.

Attention is now turned to FIG. 3, which is a sectional view like FIG. 2, but of the chip package 10 but at a higher temperature of between about 120 and 150° C. At these higher temperatures, the substrate 20 flattens substantially. The flattening of the substrate 20 produces an attendant to flattening of the semiconductor chip 40 and may produce some stretching of the thermal interface material 120, particularly in the central portion 140 thereof. As noted in the Background section hereof, the chip-substrate composite undergoes partial flattening at typical thermal interface material and/or perimeter adhesive cure temperatures. Once the temperature following cure is lowered to room or typical device operating temperature, the die-substrate warpage is more pronounced than at cure temperature which produces tensile forces on a gel-type thermal interface material of sufficient magnitude to result in a delamination, particularly at the edges of the semiconductor chip 40. Any thermal interface material delamination can significantly impact the efficient flow of heat from the semiconductor chip 40. However, the process in accordance with embodiments disclosed herein make the thermal interface material 120 much more resistant to high temperature induced warping stresses. Note the location of the dashed oval 150. The dashed oval 150 circumscribes small portions of the semiconductor chip 40, the back side metallization 110, the underfill 60, the thermal interface material 120, and the lid 30.

Figure 4:
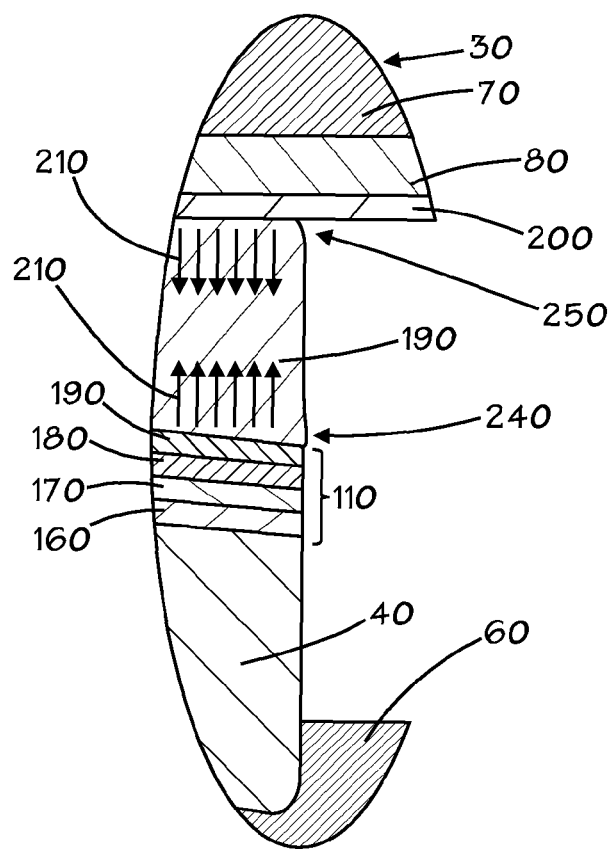
FIG. 4 is a magnified view of a portion of FIG. 3.
Figure 5:
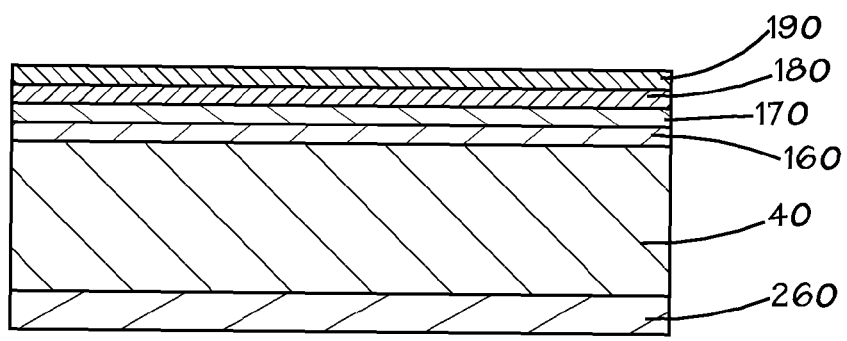
FIG. 5 is a sectional view depicting an exemplary method of forming portions of a metallization stack on a semiconductor device.

The portions of the semiconductor device package 10 circumscribed by the dashed oval 150 in FIG. 3 are shown at greater magnification in FIG. 4. Because of the shape and position of the dashed oval 150 in FIG. 3, FIG. 4 shows a small portion of the underfill material 60, the semiconductor device 40, the thermal interface material 120, and the metal jacket 80 and core 70 of the lid 30. In addition, a portion of the backside metallization stack 110 is shown. As noted above, the backside metallization layer 110 may actually be configured as a laminate structure. In this regard, and in this illustrative embodiment, the back side metallization layer may consist of an aluminum film 160 positioned on the semiconductor device 40, a titanium layer 170 positioned on the aluminum layer 160, a nickel-vanadium layer 180 positioned on the titanium layer 170 and a gold layer 190 positioned on the nickel-vanadium layer 180. An optional wetting film 200 may also be provided between the metal jacket 80 of the lid 30 and the thermal interface material 120. The film 200 may be composed of gold or whatever material may be appropriate for wetting the particular thermal interface material.

The present illustrative embodiment solves the problem of poor adhesion of a gel-type thermal interface material 120 and the gold film 190 by incorporating a catalyst material either into the layer 190 (and the layer 200 if present and desired) directly or by the usage of a topically applied solvent that includes a catalyst material. In addition, the thermal interface material 120 is cured at a low temperature to lock in some initial rigidity before the subsequent high temperature curing of the lid adhesive. The use of the catalyst enables a favorable adhesion between the gel-type interface material 120 and the underlying gold film 190. The process of providing the thermal interface material 120 to be described in more detail below leaves the thermal interface material 120 largely in a state of compression, that is, with internal compressive forces 210. Because the thermal interface material 120 is largely in a state of compression and/or below a delamination tension minimum, even at the a higher temperatures associated with chip operation, delamination at the edges 240 and 250 of the thermal interface material 120 is much less likely.

An exemplary process flow for fabricating the semiconductor package 10 depicted in FIGS. 1 and 2 may be understood by referring now to FIGS. 5, 6, 7, 8 and 9. Attention is turned initially to FIG. 5, which is a sectional view of the semiconductor device 40. The semiconductor device 40 may be provided with a polymer layer 260, composed of polyimide or other polymeric material that serves as a stress relieving cushion for the subsequent flip-chip mounting of the semiconductor device 40 to the substrate 20 depicted in FIGS. 1 and 2. The aluminum film 160 may be formed on the device 40 by physical vapor deposition or other well-known techniques. The titanium layer 170 may be formed on the aluminum layer 160 and the nickel-vanadium layer 180 on the titanium layer 170 by physical vapor deposition or other well-known techniques. The semiconductor device 40 is now ready to receive the gold film 190 and the catalytic material. The gold film 190 may be formed on the nickel-vanadium layer 180 by sputtering, e.g., physical vapor deposition or other well-known techniques. It should be understood that the films 160, 170, 180, 190 and 260 may be formed on the semiconductor device 40 an individual basis, or collectively on multiple devices 40 that are part of some larger structure, such as a wafer.

Figure 6:
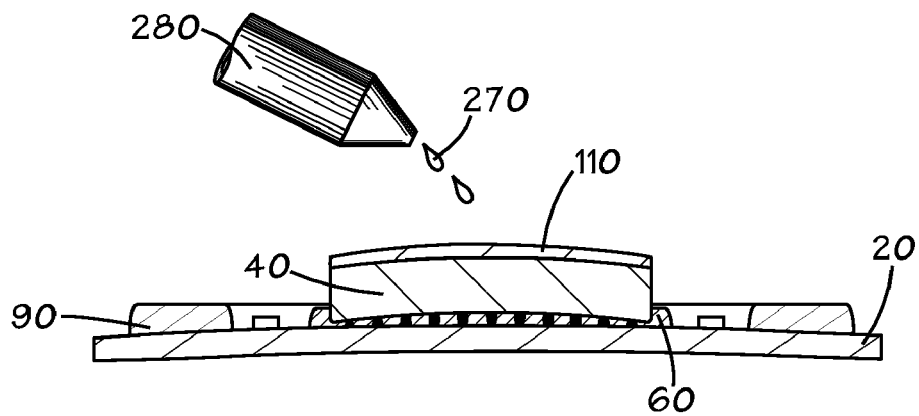
FIG. 6 is a sectional view like FIG. 5 depicting exemplary placement of catalyst on the semiconductor device.

Attention is now turned to FIG. 6, which is a sectional view of the semiconductor chip 40 mounted to the substrate 20 prior to lid attachment. At this stage, the semiconductor chip 40 is already secured to the substrate 20 and the underfill 60 is in place. The semiconductor chip 40 is already fitted with the back side metallization 110. At this point, the adhesive bead 90 may be in place. In this illustrative embodiment, a catalyst solvent 270 may be applied to the backside metallization 110, the top of which is the gold film 190 (see FIG. 5). An applicator 280 may be used to deposit the catalyst solvent 270. The purpose of the catalyst material 270 is to facilitate the bonding of the gold film 190 to a gel-type thermal interface material. Exemplary materials for the catalytic material include platinum mixed with an organic solvent, such as acetone, toluene, isopropyl alcohol or other types of alcohols.

In an alternate exemplary embodiment, the catalyst material may be introduced directly into the top-most layer of the back side metallization structure. In this regard, catalyst particles may be infused directly into the gold film 190 and the optional overlying gold film 200 of the lid 30 shown in FIG. 4. The catalyst particles may be introduced into the gold films 190 and 200 by a variety of techniques. In an exemplary embodiment, a catalyst material may be introduced into the sputtering stream or plating liquid used to deposit the gold films 190 and 200. The presence of the catalyst materials in the layers 190 and 200 facilitate the bonding of the gel-type thermal interface material 190 to the gold layers 190 and 200. It is anticipated that a concentration of about 0.02 to 1% platinum by volume may be used for a solvent catalyst. For a directly introduced catalyst, the concentration of catalyst in the sputtered material for the layers 190 and 200 may be about 0.5 to 20 molar % in an exemplary embodiment and about 1-3 molar % in another exemplary embodiment. If desired, both techniques may be combined, that is, catalyst may be introduced directly into the metal layers during deposition and also applied to the metal layers in solvent form. This may be advantageous where maximum coverage is desired.

Figure 7:
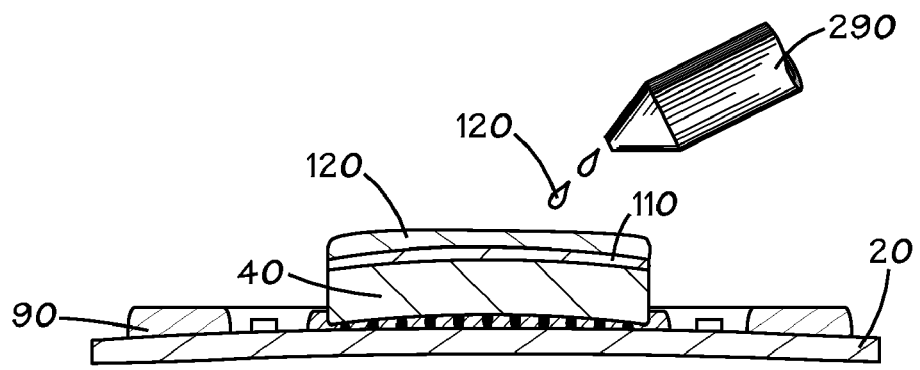
FIG. 7 is a sectional view like FIG. 6 depicting exemplary placement of a thermal interface material on the semiconductor device.

Referring now to FIG. 7, the thermal interface material 120 is dispensed on the backside metallization 110 by way of a dispenser 290. The dispenser may be a nozzle, a wiper, or some other type of dispenser. The thermal interface material 120 is then allowed to cure at or near room temperature for a selected period of time before the lid 30 (not shown) is seated on the adhesive 90 and the adhesive 120 is subjected to two high temperature thermal cures. It is anticipated that the presence of the catalyst either in or on the top layer of the back side metallization 110 will facilitate the low temperature curing of the thermal interface material. The goal is to lock in a certain rigidity in the thermal interface material 120 when the substrate 20 is highly warped so that the thermal interface material 120 will remain largely in compression when the substrate 20 flattens during subsequent high temperature steps. In an exemplary embodiment, the thermal interface material 120 is allowed to cure at about 22 to 50° C. for about 45 to 90 minutes. In another embodiment, the cure may be done at about 22 to 125° C. for about 45 to 90 minutes. In still another embodiment, the catalyst may be coated with a coating that dissolves at temperature so that a temperature activated catalyst process may be used. Optionally, the thermal interface material 120 may include some photosensitive compounds and the low temperature cure may be facilitated by stimulating the material 120 with radiation. The wavelength may be varied. In an exemplary embodiment, UV radiation may be used.

Figure 8:
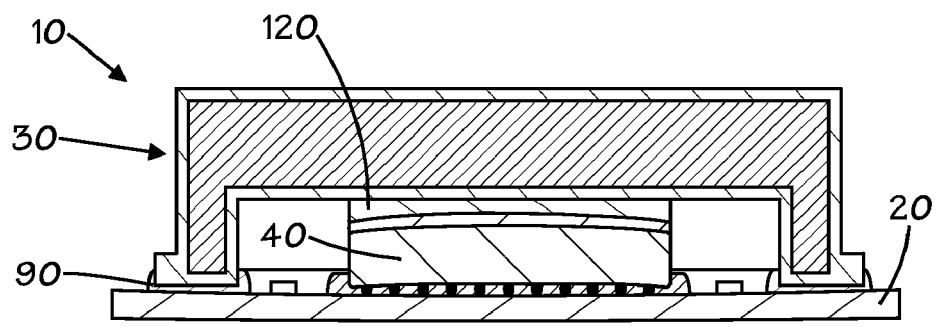
FIG. 8 is a sectional view like FIG. 7 depicting placement of a lid on the semiconductor device.

Next, and as shown in FIG. 8, the lid 30 may be seated on the adhesive bead 90 and the package 10 subjected to a high temperature cure to cure the adhesive 90. The high temperature cure may be a two stage cure that consists of a medium high temperature step at about 90 to 110° for about 45 to 70 minutes followed by a high temperature cure at about 140 to 160° C. for about 90 to 140 minutes. The medium high temperature step is designed to drive out any lingering solvents without boiling. The high temperature step is designed to provide a final cure for the adhesive 90. Because the thermal interface material 120 has already undergone a low-temperature cure, the flattening of the substrate 20 during the high-temperature cure of the adhesive 90 will not produce as much risk of delamination of the thermal interface material 120 as the substrate 20 and the chip 40 flatten.

In the foregoing illustrative embodiment, the thermal interface material is deposited as a blanket layer and allowed to cure at low temperature. In an alternate exemplary embodiment, thermal interface material may be deposited on the semiconductor chip into a preselected pattern that does not cover the entire chip. The preselected pattern of thermal interface material is allowed to stage or cure at low temperature for some period of time. Thereafter, additional thermal interface material may be deposited on the chip and over the previously deposited preselected pattern of thermal interface material and another at low temperature cure may be performed as a prelude to the subsequent attachment of a lid to the substrate. In this regard, attention is now turned to FIG. 9, which is a plan view of a semiconductor chip 300 mounted on a semiconductor substrate 310. And underfill 320 between the chip 300 and the substrate 310 is present. At this point, a dispenser 330 may be used to deposit a portion of thermal interface material 340 in a preselected pattern, in this case in the general shape of an X. The X pattern consists of a central portion 350 and four legs, two of which are labeled 360 and 370. The thermal interface material 340 may be composed of the same materials as the other embodiments disclosed elsewhere herein. The preselected pattern may be virtually any shape. A catalyst of the types described elsewhere herein may be applied prior to deposition of the portion of thermal interface material 340 if desired.

Figure 9:
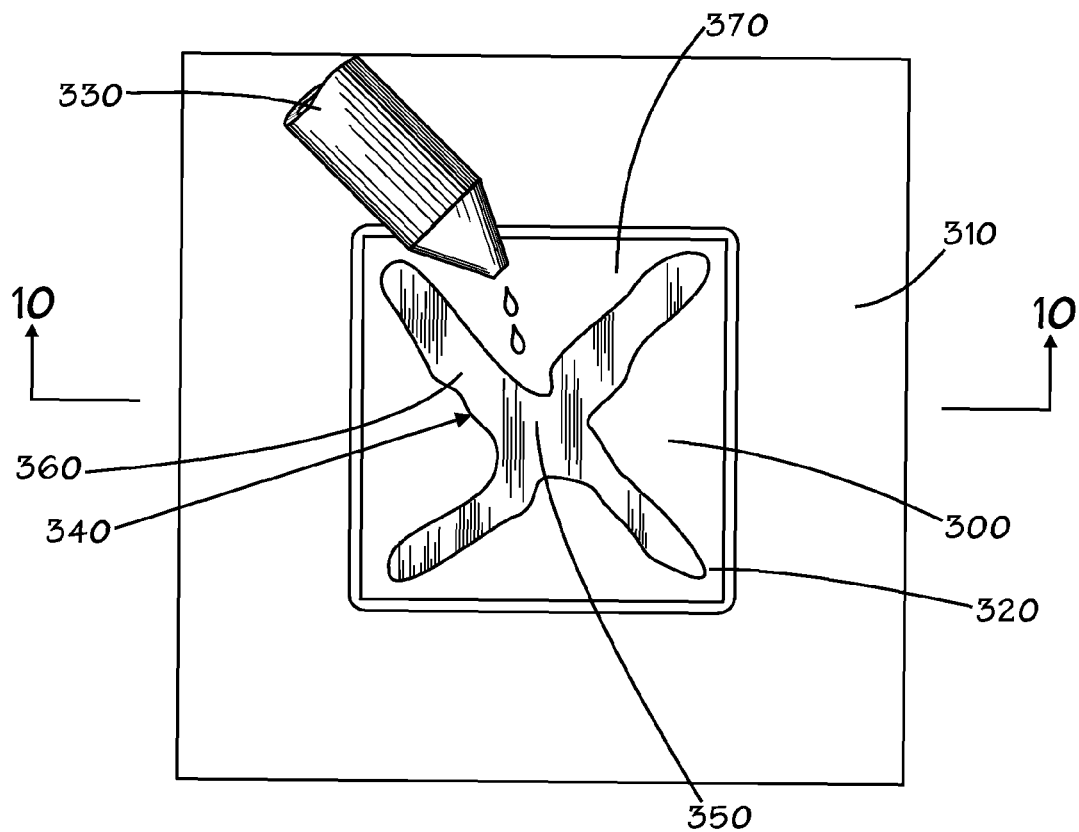
FIG. 9 is a plan view of an exemplary semiconductor chip receiving an exemplary preselected pattern of a thermal interface material.
Figure 10:
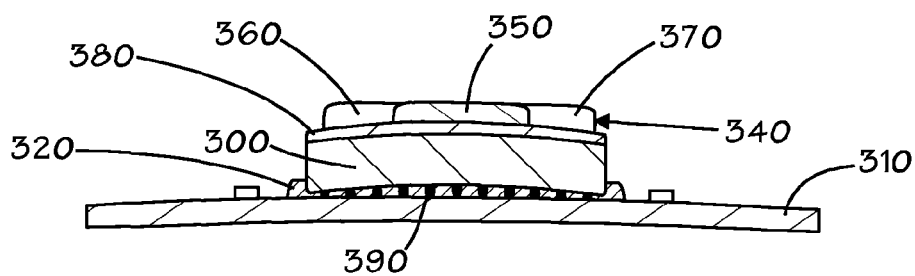
FIG. 10 is a sectional view of FIG. 9 taken at section 10-10.

Attention is now turned to FIG. 10, which is a sectional view of FIG. 9 taken at section 10-10. Note that the position of section 10-10 is such that the central portion 350 is shown in section and portions of the legs 360 and 370 are visible. The thermal interface material portion 340 is positioned on a backside metallization 380 of the semiconductor chip 300. Like the other embodiments disclosed herein, the chip 300 may be electrically interconnected to the substrate 310 by way of interconnect structures 390. The chip 300, the substrate 310, the underfill 320 and the interconnects 390 may be configured as disclosed elsewhere herein for the other embodiments. The preselected portion 340 is allowed to undergo a low temperature cure to partially set up. The semi-rigid portion 340 thereafter inhibits the squeeze out of thermal interface material that normally occurs when a lid is secured to the substrate 310 and a high temperature adhesive cure is performed. The low temperature cure may be performed at about 22 to 50° C. for about 45 to 70 minutes. Radiation may be used as well as described elsewhere herein.

Figure 11:
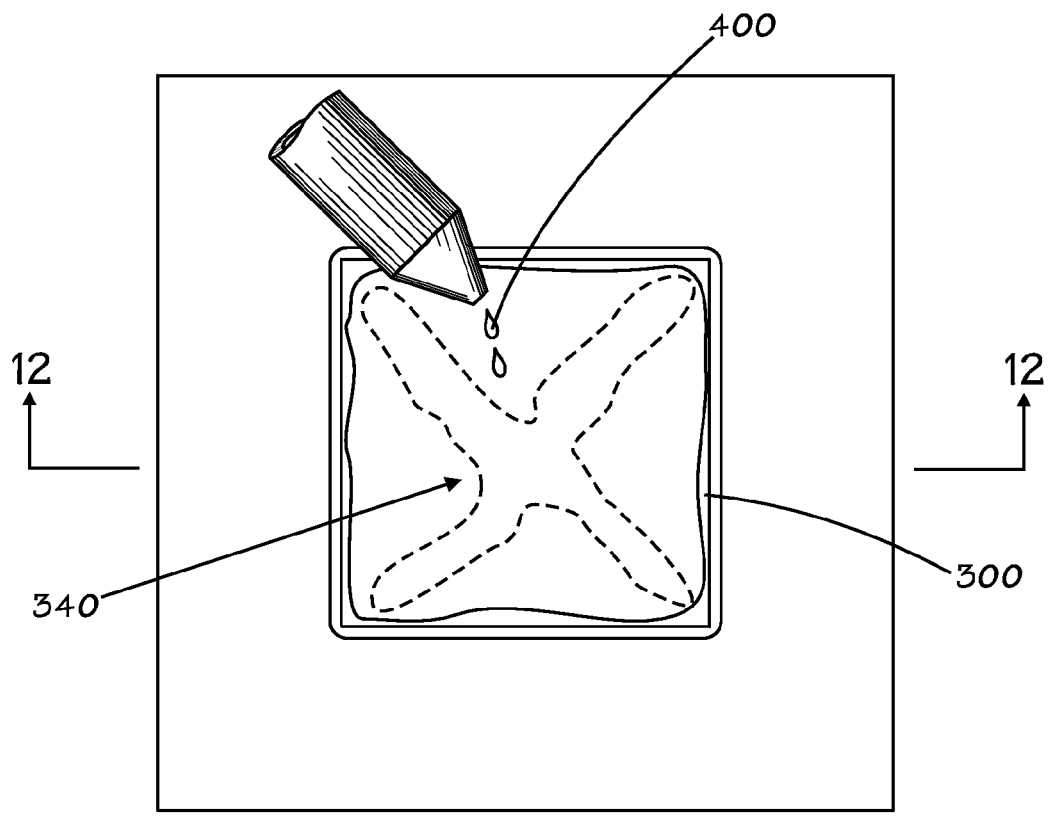
FIG. 11 is a plan view like FIG. 9 depicting exemplary placement of additional thermal interface material on the semiconductor chip.
Figure 12:
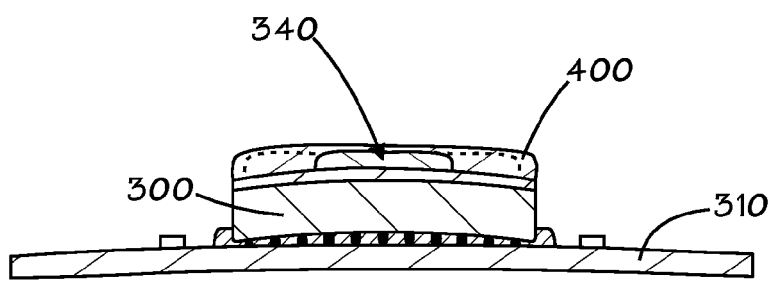
FIG. 12 is a sectional view of FIG. 11 taken at section 12-12.

Attention is now turned to FIG. 11, which is an overhead view like FIG. 9. At this stage, additional thermal interface material 400 is deposited on the chip 300 over the preselected portion 340 of thermal interface material, which is now shown in phantom. As shown in FIG. 12, which is a sectional view of FIG. 11, taken at section 12-12, the additionally deposited thermal interface material 400 advantageously covers the previously deposited preselected portion 340 of thermal interface material. Another low temperature cure at, for example, about 22 to 50° C. for about 45 to 70 minutes, may be performed to partially cure the additional material 400. With the semi-hardened preselected portion 340 in place, a lid, such as the lid 30 disclosed elsewhere herein, may be placed on the additional thermal interface material 400 and the preselected portion 340 will act as a support structure to prevent the excessive squeeze out of thermal interface material 400. The low temperature cured thermal interface material, actually a combination of the preselected portion 340 and the additional portion 400, is resistant to delamination due to flattening of the substrate 310 and the chip 300.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a metal layer on a semiconductor chip coupled to a substrate;
   applying a catalyst to the metal layer;
   placing a gel-type thermal interface material in a preselected pattern on the semiconductor chip after applying the catalyst, the preselected pattern having a different shape than a footprint of the semiconductor chip;
   allowing the preselected pattern of gel-type thermal interface material to partially set up; placing additional thermal interface material on the semiconductor chip; and
   curing the additional thermal interface material.

2. The method of claim 1, wherein the preselected pattern comprises an X shape.

3. A method of manufacturing, comprising:
   applying a catalyst to a semiconductor chip coupled to a substrate;
   placing a gel-type thermal interface material in a preselected pattern on the semiconductor chip after applying the catalyst, the preselected pattern having a different shape than a footprint of the semiconductor chip;
   allowing the preselected pattern of gel-type thermal interface material to partially set up; placing additional thermal interface material on the semiconductor chip; and
   curing the additional thermal interface material.

4. The method of claim 3, wherein the catalyst comprises a mixture of alcohol and platinum.

5. The method of claim 3, wherein the step of allowing the preselected pattern of gel-type thermal interface material to partially set up comprises maintaining the preselected pattern of gel-type thermal interface material at about 22 to 125° C. for about 45 to 90 minutes.

6. The method of claim 3, comprising coupling a lid to the thermal interface material.

7. A method of manufacturing, comprising:
   placing a gel-type thermal interface material on a semiconductor chip coupled to a substrate; forming a metal layer on the semiconductor chip and applying a catalyst to the metal layer prior to placing the gel-type thermal interface material; and
   curing the gel-type thermal interface material by allowing it to cure at or near room temperature and subsequently subjecting it to high temperature curing, whereby the thermal interface material will remain largely in compression.

8. The method of claim 7, wherein the catalyst comprises a mixture of alcohol and platinum.

9. The method of claim 7, wherein the curing comprises stimulating the thermal interface material with radiation.

10. The method of claim 9, wherein the radiation comprises ultraviolet radiation.

11. The method of claim 7, comprising coupling a lid to the thermal interface material.

12. A method of manufacturing, comprising:
    forming a metal layer on a semiconductor chip coupled to a substrate, the metal layer including a catalyst;
    placing a gel-type thermal interface material in a preselected pattern on the semiconductor chip after forming the metal layer, the preselected pattern having a different shape than a footprint of the semiconductor chip;
    allowing the preselected pattern of gel-type thermal interface material to partially set up; placing additional thermal interface material on the semiconductor chip; and
    curing the additional thermal interface material.

13. A method of manufacturing, comprising: forming a metal layer on a semiconductor chip; coupling the semiconductor chip to a substrate; providing a catalyst on the metal layer;
    placing a gel-type thermal interface material on the metal layer; and
    curing the gel-type thermal interface material by allowing it to cure at or near room temperature and subsequently subjecting it to high temperature curing, whereby the thermal interface material will remain largely in compression.

14. The method of claim 13, wherein the catalyst comprises a mixture of alcohol and platinum.

15. The method of claim 13, wherein the curing comprises stimulating the thermal interface material with radiation.

16. The method of claim 13, comprising subjecting the thermal interface material to two high temperature cures.

17. The method of claim 13, comprising coupling a lid to the thermal interface material.

18. A method of manufacturing, comprising: forming a metal layer on a semiconductor chip; coupling the semiconductor chip to a substrate; providing a catalyst on the metal layer;
    placing a gel-type thermal interface material on the metal layer; and
    curing the gel-type thermal interface material at about 22 to 125° C., wherein the providing a catalyst comprises forming the metal layer containing a catalyst.

19. A method of manufacturing, comprising:
    placing a gel-type thermal interface material in a preselected pattern on a semiconductor chip coupled to a substrate;
    allowing the preselected pattern of gel-type thermal interface material to partially set up; placing additional thermal interface material on the semiconductor chip;
    forming a metal layer on the semiconductor chip and applying a catalyst to the metal layer prior to placing the preselected pattern of thermal interface material; and
    curing the additional thermal interface material.

20. A method of manufacturing, comprising: placing a gel-type thermal interface material in a preselected pattern on a semiconductor chip coupled to a substrate;
    allowing the preselected pattern of gel-type thermal interface material to partially set up; placing additional thermal interface material on the semiconductor chip;
    forming a metal layer on the semiconductor chip prior to placing the preselected pattern of thermal interface material, the metal layer including a catalyst; and
    curing the additional thermal interface material.

21. A method of manufacturing, comprising:
    placing a gel-type thermal interface material in a preselected pattern on a semiconductor chip coupled to a substrate; forming a metal layer on the semiconductor chip prior to placing the preselected pattern of thermal interface material, the metal layer including a catalyst; and
    curing the gel-type thermal interface material at about 22 to 125° C.

* * * * *